United States Patent [19]
Laridon et al.

[11] 3,847,610
[45] Nov. 12, 1974

[54] PHOTOPOLYMERISATION OF ETHYLENICALLY UNSATURATED ORGANIC COMPOUNDS

[75] Inventors: Urbain Leopold Laridon, Wilrijk; Gérard Albert Delzenne, S-Gravenwezel; Hugo Karel Peeters, Berchem, all of Belgium

[73] Assignee: Gevaert-Agfa, N.V., Mortsel, Belgium

[22] Filed: Oct. 9, 1969

[21] Appl. No.: 865,191

[30] Foreign Application Priority Data

Nov. 26, 1968 Great Britain ..................... 56094/68

[52] U.S. Cl. ................ 96/35.1, 96/91 R, 96/115 P, 204/159.24, 260/141

[51] Int. Cl. ............................ G03c 1/70, G03c 1/52

[58] Field of Search .................... 96/35.1, 115 P, 91; 204/159.24

[56] References Cited

UNITED STATES PATENTS

| | | | |
|---|---|---|---|
| 3,099,558 | 7/1963 | Levinos | 96/35.1 X |
| 3,138,460 | 6/1964 | Levinos | 96/115 X |
| 3,166,539 | 1/1965 | Schucharot | 204/159.24 X |
| 3,192,194 | 6/1965 | Burg | 96/115 X |
| 3,278,304 | 10/1966 | Conix et al. | 96/115 X |
| 3,467,518 | 9/1969 | Laridon et al. | 96/35.1 |

*Primary Examiner*—Ronald H. Smith
*Attorney, Agent, or Firm*—A. W. Breiner

[57] ABSTRACT

A process for the photopolymerization of ethylenically unsaturated organic compounds, is disclosed, which comprises irradiating with actinic light a composition comprising a photopolymerizable ethylenically unsaturated organic compound and as a photopolymerization initiator a compound containing at least one diazosulphone group, said compound corresponding to one of the formulae:

$$X—SO_2—N{=}N—Y$$

and $$X'—SO_2—N{=}N—Z—N{=}N—SO_2—X'$$

14 Claims, No Drawings

PHOTOPOLYMERISATION OF ETHYLENICALLY UNSATURATED ORGANIC COMPOUNDS

The present invention relates to the photopolymerisation of ethylenically unsaturated organic compounds and to polymers obtained therefrom.

The photopolymerisation of ethylenically unsaturated organic compounds can be initiated by exposure to high intensity radiation such as ultraviolet rays. Methyl acrylate, for instance, on long standing in sun light is transformed into a transparent mass (cf. Ellis: The Chemistry of Synthetic Resins, Vol. II (1935) page 1072). Polymerisation, however, by the use of light alone, proceeds at a very much slower rate when compared to polymerisation brought about by a free radical-generating catalyst or by heat. Moreover, the use of light alone, unaided by other agents, requires very long exposure times in order to polymerise the monomer sufficiently. Furthermore, the low rate of polymerisation necessitates the use of extremely intense radiations such as those obtained from high intensity mercury vapour lamps or carbon arcs.

Many photopolymerisation initiators, which under the influence of actinic light increase the photopolymerisation rate, have already been described. A survey of such photopolymerisation initiators has been given by G. Delzenne in Industrie Chimique Belge, 24 (1959) 739–764.

An object of the present invention is to provide a new class of photopolymerisation initiators, which can be activated by actinic light.

Another object of the present invention is to provide a new class of photopolymerisation initiators, which require a very short exposure to actinic light.

According to the present invention a process is provided for the photopolymerisation of ethylenically unsaturated organic compounds, which process comprises irradiating with actinic light a composition comprising a photopolymerisable ethylenically unsaturated organic compound and as a photopolymerisation initiator a compound containing at least one diazosulphone group, said compound corresponding to one of the formulae:

$$X—SO_2—N{=}N—Y$$

and $$X'—SO_2—N{=}N—Z—N{=}N—SO_2—X'$$

wherein:

X represents phenyl, naphthyl, or phenyl substituted in ortho, meta or paraposition with respect to the sulphonyl group by alkyl of one to four carbon atoms, carboxyl, amino, dialkylamino wherein the alkyl groups comprise one to four carbon atoms, acylamino wherein the acyl group comprises two to seven carbon atoms, phenylazo or nitrophenylazo;

X' represents phenyl, aminophenyl or alkylphenyl wherein the alkyl group comprises one to four carbon atoms;

Y represents pyridyl, anthraquinonyl, naphthyl, acridinyl, benzothiazolyl or a group of the formula

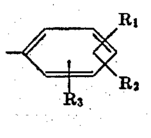

wherein:

$R_1$ represents hydrogen, alkyl of one to four carbon atoms, nitro, alkoxy of one to four carbon atoms, carboxyl or sodium sulphonyl or NR'R'' wherein R' is hydrogen, alkyl of one to four carbon atoms, phenyl, acyl wherein the acyl group comprises two to seven carbon atoms, p-methoxybenzoyl, p-nitrophenyl, naphthyl, acryloyl, methacryloyl ordialkylaminophenylcarbamoyl with alkyl groups of one to four carbon atoms; R'' is hydrogen, alkyl of one to four carbon atoms, or phenyl;

$R_2$ represents hydrogen, halogen, alkoxy with one or two carbon atoms, alkyl of one or two carbon atoms, or nitro;

$R_3$ represents hydrogen, halogen, alkoxy with one or two carbon atoms, or alkyl of one or two carbon atoms;

$R_1$, $R_2$ and $R_3$ standing in ortho, meta or paraposition with respect to the diimide group; and Z represents a radical of the formulae:

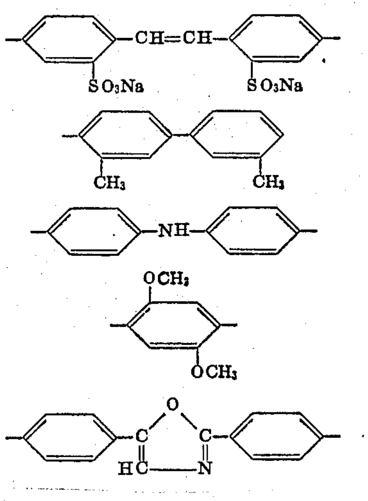

Examples of suitable photopolymerisation initiators are:

1. (phenylsulphonyl)-(p-tolyl)-diimide
2. (phenylsulphonyl)-(p-carboxyphenyl)-diimide
3. (phenylsulphonyl)-(p-nitrophenyl)-diimide
4. (phenylsulphonyl)-(p-methoxyphenyl)-diimide
5. (phenylsulphonyl)-(p-sulphophenyl)-diimide sodium salt
6. (p-tolylsulphonyl)-(4-pyridyl)-diimide
7. (p-tolylsulphonyl)-(9-acridinyl)-diimide
8. (p-tolylsulphonyl)-(2-benzothiazolyl)-diimide
9. (p-tolylsulphonyl)-(1-naphthyl)-diimide
10. (p-tolylsulphonyl)-(2-naphthyl)-diimide
11. (p-tolylsulphonyl)-(1-anthrachinonyl)-diimide
12. (p-tolylsulphonyl)-(p-dimethylaminophenyl)-diimide
13. (p-tolylsulphonyl)-(4-diethylamino-2-methylphenyl)-diimide
14. (p-tolylsulphonyl)-(p-acetamidophenyl)-diimide
15. (p-tolylsulphonyl)-(p-benzamidophenyl)-diimide
16. (p-tolylsulphonyl)-(N-phenyl-p-benzamidophenyl)-diimide 17. (p-tolylsulphonyl)-[p(p'-methoxy-benzamido)-phenyl]-diimide
18. (p-tolylsulphonyl)-(2-chloro-5-methoxy-4-propionamidophenyl)-diimide
19. (p-tolylsulphonyl)-(p-methacrylamidophenyl)-diimide
20. (p-tolylsulphonyl)-[(p'-nitrophenyl) (p-aminophenyl)]-diimide
21. (p-tolylsulphonyl)-[(N-methyl) (N-p'-nitrophenyl)-p-amino-phenyl]-diimide
22. (p-tolylsulphonyl)-[p(2-naphthylamino)-phenyl]-diimide
23. (p-tolylsulphonyl)-(p-benzoylphenyl)-diimide
24. (p-tolylsulphonyl)-(p-diethylaminophenylcarbamoylphenyl)-diimide
25. (m-carboxyphenylsulphonyl)-(p-carboxyphenyl)-diimide
26. (p-aminophenylsulphonyl)-(p-diethylaminophenyl)-diimide
27. (p-acetamidophenylsulphonyl)-(p-tolyl)-diimide
28. (p-acetamidophenylsuphonyl)-(p-diethylaminophenyl)-diimide
29. (p-acetamidophenylsulphonyl)-(4-benzamido-2,5-diethoxyphenyl)-diimide
30. (p-dimethylaminophenylsulphonyl)-(p-nitrophenyl)-diimide
31. (p-dimethylaminophenylsulphonyl)-(p-diethylaminophenyl)-diimide
32. (1-naphthylsulphonyl)-(p-tolyl)-diimide
33. 3,3'-dimethyl-4,4-bis(p-aminophenylsulphonylazo)-biphenyl
34. 2,5-bis[4(p-tolylsulphonylazo)-phenyl]-oxazole
35. 4-(p-tolylsulphonylazo)-azobenzene
36. 1,4-dimethoxy-2(p-nitrophenylazo)-5(p-tolylsulphonylazo)-benzene
37. 4,4'-bis(p-tolylsulphonylazo)-diphenylamine
38. 4,4'-bis(phenylsulphonylazo)-2,2'-stilbene disulphonic acid disodium salt.

All these photopolymerisation initiators comprise at least one diazosulphone group. They are easily synthetised starting from diazonium salts and sulphinic acids.

The quantity of photopolymerisation initiator to be used will of course depend upon many variables including the particular initiator used, the wavelength of light employed, the irradiation time and the monomer or monomers present. Usually, the amount of photopolymerisation initiator is within the range of 0.01 to 5 percent by weight based on the amount of monomeric material initially present. It is seldom necessary to employ more than 0.2 to 2 percent by weight to obtain a good polymerisation rate.

The ethylenically unsaturated organic compounds may be exposed to any source of radiation emitting actinic light rays in the wavelength range of 2,500–5,000 A., particularly in the wavelength region of 3,000–5,000 A. Suitable light sources include carbon arcs, mercury vapor lamps, fluorescent lamps, argon lamps, photographic flood lamps and tungsten lamps. Moreover, ordinary daylight may be used too.

A considerable increase in the rate of polymerisation can also be obtained by adding activating dyes taken from the class of acridine, phenazine, thiazine and xanthene dyes, and more particularly photo-oxidation sensitizers in a concentration of 0.001 to 0.1 percent by weight based on the monomeric material present. In this case the useful wavelength range can be extended up to 7,000 A.

The photopolymerisation can be carried out according to any of the well-known processes, e.g., bulk, emulsion, suspension, and solution polymerisation processes. In all these processes, the addition of a photopolymerisation initiator according to the invention to polymerisable materials subjected to the action of actinic light greatly increases the rate of photopolymerisation.

A base or support may be coated with a solution of the photopolymerisable organic compound in a solvent therefor, this solution containing in dissolved state or homogeneously dispersed therein a photopolymerisation initiator according to the invention, whereupon the solvent or solvent mixture is eliminated by known means such as evaporation, leaving a more or less thin coating of the photopolymerisable organic compound on the base or support. Subsequently, the dried photopolymerisable coating is exposed to actinic light rays.

When exposing the photopolymerisable composition to actinic light rays the polymerisation does not start immediately. Only after a short period, which among others depends on the ethylenically unsaturated organic compound(s), the photopolymerisation initiator and the light-intensity used, the photopolymerisation starts. The period necessary for obtaining a perceptible amount of polymerisation is a measure of the efficiency of the photopolymerisation initiator, and is named the inhibition period.

In some circumstances it may be desirable that the photopolymerisable composition comprises a hydrophilic or hydrophobic colloid as carrier or binding agent for the ethylenically unsaturated organic compounds and the photopolymerisation initiator. By the presence of this binding agent the properties of the light-sensitive layer are of course highly influenced. The choice of the binding agent is dependent on its solubility in solvents, which can also be used as solvents for the ethylenically unsaturated organic compounds and for the photopolymerisation initiator of the invention. Such binding agents are for instance polystyrene, polymethyl methacrylate, polyvinyl acetate, polyvinyl butyral, partially saponified cellulose acetate and other polymers that are soluble in solvents for initiators and monomers. In some instances water-soluble polymers can be used such as gelatin, casein, starch, carboxymethyl cellulose and polyvinyl alcohol. It is evident that the ratio of photopolymerisable monomer(s) to binding agent also influences the photopolymerisation. The larger this ratio, the higher is the photopolymerisation rate generally of a particular ethylenically unsaturated organic compound.

If the photopolymerisable composition is water-soluble water may be used as solvent for coating the support. On the contrary, if water-insoluble photopolymerisable compositions are used, organic solvents, mixtures of organic solvents, or mixtures of organic solvents and water may be used.

The process of the invention is applied to the photopolymerisation of compositions comprising ethylenically unsaturated organic compounds. These compositions may comprise one or more ethylenically unsaturated polymerisable compounds such as styrene, acrylamide, methacrylamide, methyl methacrylate and acrylonitrile. When two of these monomers are used in the same photopolymerisable composition or if they are mixed with other polymerisable compounds, copolymers are formed during the photopolymerisation. It is further presumed that in the case where the photopolymerisable material is used together with a polymeric binding agent, graft copolymers are formed between the polymeric binder and the photopolymerised material.

The photopolymerisable composition may also comprise or consist of unsaturated compounds having more than one carbon-to-carbon double bond, e.g., two terminal vinyl groups, or of a polymeric compound having ethylenic unsaturation. During polymerisation of these compositions usually cross-linking will occur by means of the plurally unsaturated compound. Examples of compounds containing more than one carbon-to-carbon double bond are, e.g., divinylbenzene, diglycol diacrylates and N,N'-alkylenebis-acrylamides. Examples of polymeric compounds containing ethylenic unsaturation are e.g., allyl esters of polyacrylic acid, maleic esters of polyvinyl alcohol, polyhydrocarbons still containing carbon-to-carbon double bonds, unsaturated polyesters, cellulose acetomaleates, and allyl cellulose.

In the photopolymerisation of ethylenically unsaturated compounds with photopolymerisation initiators of the invention high temperatures are not needed. The exposure, however, to strong light sources at a relatively short distance, brings about a certain heating of the mass to be polymerised, which heating exercises a favourable influence upon the polymerisation rate.

The products of the invention are useful as adhesives, coating and impregnating agents, safety glass interlayers, etc. When photopolymerisation of the compositions is carried out within a mold, optical articles such as lenses can be obtained.

The photopolymerisable compositions, which contain photopolymerisation initiators according to the invention are useful in the preparation of photographic images. In this respect the present invention also comprises spreading the polymerisable composition upon a surface such as a surface of metal and printing a design thereon photographically by exposure to light through a suitable image pattern. Hereby the light induces polymerisation in the exposed areas of the photopolymerisation composition, so that the polymeric layer is rendered insoluble in the solvent or solvents used for applying the photopolymerisable layer. Subsequently, the nonexposed areas are washed away with a solvent for the monomeric material. In this way printing plates and photographic resist images are manufactured, which can be further used as planographic printing plates, as matrices for printing matter, as screens for silk-screen printing, and as photoresists for etching.

The imagewise photopolymerisation can also induce differential softening properties to the layer. This makes possible a reproduction process by material transfer when the image-wise imagewise layer is subsequently warmed up and pressed against a receiving sheet, so that the softened areas are transferred to the receiving sheet.

The following examples illustrate the present invention.

EXAMPLE 1

A series of solutions containing 3 g. of acrylamide dissolved in 7.5 ml. of water were added to 4 ccs. of ethylene glycol monomethyl ether. To each solution $1.10^{-5}$ mole of a different photopolymerisation initiator was added. The resulting solutions were then poured into chemically and heat-resistant glass tubes. Exposure occurred with an 80 Watt high pressure mercury vapor lamp at a distance of 10 cm. As a result of the exposure and depending on the particular photopolymerisation initiator used, the solutions become viscous, whereafter solidification representing a polymer yield of 90 to 95 percent occurs. The results of the exposure test are shown in Table I.

Table I

| Photopolymerisation initiator (*) | Viscous | Solid |
|---|---|---|
| 1 | after 10' | after 15' |
| 2 | 10' | 23' |
| 3 | 4' | 20' |
| 4 | 8' | 18' |
| 25 | 8' | 20' |
| 27 | 11' | 22' |

(*) The numbers refer to the numbers of the particular photopolymerisation initiators given above.

EXAMPLE 2

The influence of dyestuffs as activators in the photopolymerisation reactions is demonstrated by the following experiments.

The following ingredients were mixed in chemical and heat-resistant glass tubes:

7.5 ml. of an aqueous solution containing 3 g. of acrylamide 3.9 ml. of ethylene glycol monomethyl ether 2.76 mg. of (phenylsulphonyl)-(p-carboxyphenyl)-diimide (photopolymerisation initiator No. 2)

$1.10^{-7}$ mole of an activating dyestuff

The glass tubes were shaken in the dark until complete dissolution occurred. The solutions were then exposed as in Example 1. Results of the experiments are listed in Table II.

Table II

| Activating dyestuff | Colour index | Viscous | Solid |
|---|---|---|---|
| Thionine | 52,025 | after 15–20 | after 1'30" |
| Erythrosin | 45,430 | after 30–45" | after 1'30"–2' |
| Methylene blue | 52,015 | after 15–20" | after 1'30" |
| Benzoflavine | 46,065 | after 1' | after 2–3' |
| Red Acid XB | 45,100 | after 8' | after 10–15' |
| Flavinduline | 50,000 | after 7–8' | after 10–15' |

EXAMPLE 3

The following ingredients were poured into chemically and heat-resistant glass tubes:

7.5 ml. aqueous solution containing 3 g. of acrylamide 3.9 ml. of ethylene glycol monomethyl ether $1.10^{-5}$ mole of a photopolymerisation initiator 0.1 ml. ($10^{-7}$ mole) of a 0.1 percent solution of rose bengale in ethylene glycol monomethyl ether The exposure was performed with an 80 Watt mercury vapor lamp at a distance of 10 cm., whereby after a certain time the solution became viscous and then solidified. The results are listed in Table III.

Table III

| Photopolymerisation initiator (*) | Viscous | Solid |
|---|---|---|
| No. 1 | after 45'' | after 2' |
| B | 1' | 2' |
| 3 | 1' | 3' |
| 4 | 45'' | 2' |
| 5 | 30'' | 1'30'' |
| 6 | 1' | 9' |
| 7 | 26' | — |
| 8 | 2' | 4' |
| 9 | — | 1'30'' |
| 10 | — | 1'30'' |
| 11 | 13' | 25' |
| 12 | 3' | 9' |
| 13 | 30' | — |
| 14 | 30'' | 1' |
| 15 | 1' | 2' |
| 16 | 1' | 6' |
| 17 | 3' | 6' |
| 18 | 2' | 5' |
| 19 | — | 1'30'' |
| 20 | 1' | 9' |
| 21 | 7' | 19' |
| 22 | 3' | 10' |
| 23 | 1' | 1'30'' |
| 24 | 7'30'' | 23' |
| 25 | 45'' | 2' |
| 26 | 5' | 10' |
| 27 | 45'' | 1'30'' |
| 28 | 25' | 33' |
| 29 | 5' | 15' |
| 30 | 10' | 25' |
| 31 | 5' | 45' |
| 32 | 45'' | 2' |
| 33 | 1' | 5' |
| 34 | 3' | 5' |
| 35 | 3' | 5' |
| 36 | 20' | 35' |
| 37 | 5' | 35' |
| 38 | 2' | 7' |

(*) The numbers refer to the numbers of the particular photopolymerisation initiators given above

EXAMPLE 4

Solutions were formed from the following components:

50 percent by volume of monomer 50 percent by volume of solvent (benzene or acetone)

To these solutions $10^{-3}$ mole of (phenylsulphonyl)-(p-methoxyphenyl)-diimide (photopolymerisation initiator No. 4) was added per litre, whereas to some solutions $5.10^{-6}$ mole/litre of Rose Bengale was added as activating dyestuff.

The different solutions were poured in pressure tubes, which were rinsed for 10 minutes with a nitrogen flux and then sealed.

The exposure was carried out with a 300 Watt high-pressure mercury vapor lamp at a distance of 18 cm. The exposure time was 2 hours in benzene medium and 3 hours in acetone medium.

After exposure the pressure tubes were opened. The polymer formed was then precipitated in methanol and dried in vacuo at room temperature. The polymer yield is given in table IV.

Table IV

| Monomer | Polymer yield in % by weight | |
|---|---|---|
| | Benzene medium without Rose Bengale | Acetone medium with Rose Bengale |
| Methyl methacrylate | 5.07 | 9.22 |
| Styrene | — | 1.34 |
| Acrylonitrile | 9.5 | 19.8 |

EXAMPLE 5

The following ingredients were placed in a flask of 200 ml.:

10 g. of copolymer of ethylene and maleic anhydride (50:50) dried at 110°C.

3 g. of acrylamide 0.05 g. of (phenylsulphonyl)-(p-carboxyphenyl)-diimide (photopolymerisation initiator No. 2)

0.005 g. of Rose Bengale 0.01 g. of 2,6-di-tert.butyl-p-cresol 50 ml. of acetone The whole was shaken in the dark till complete dissolution. Subsequently the solution was filtered, coated on a glass plate and dried in the dark.

The resulting layer was exposed through a negative by means of an 80 Watt mercury vapor lamp placed at a distance of 10 cm. The unexposed areas of the layer were then washed away with acetone.

An exposure time of 15 min. sufficed for obtaining a fine relief image.

We claim:

1. A process for the photopolymerisation of ethylenically unsaturated organic compounds, which comprises irradiating with actinic light a composition comprising a photopolymerisable ethylenically unsaturated organic compound and as a photopolymerisation initiator a compound containing at least one diazosulphone group, said compound corresponding to one of the formulae:

$$X—SO_2—N{=}N—Y \text{ and}$$

$$X'—SO_2—N{=}N—Z—N{=}N—SO_2—X'$$

wherein:

X represents phenyl, naphthyl, or phenyl substituted in ortho, meta or paraposition with respect to the sulphonyl group by alkyl of one to four carbon atoms, carboxyl, amino, dialkylamino wherein the alkyl groups comprise one to four carbon atoms, acylamino wherein the acyl group comprises two to seven carbon atoms, phenylazo or nitrophenylazo;

X' represents phenyl, aminophenyl or alkylphenyl wherein the alkyl group comprises one to four carbon atoms;

Y represents pyridyl, anthraquinonyl, naphthyl, acridinyl, benzothiazolyl or a group of the formula

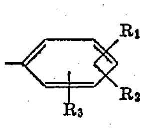

wherein:

$R_1$ represents hydrogen, alkyl of one to four carbon atoms, nitro, alkoxy, of one to four carbon atoms, carboxyl, or sodium sulphonyl, or NR'R'' wherein R' is hydrogen, alkyl of one to four carbon atoms, phenyl, acyl wherein the acyl group comprises two to seven carbon atoms, p-methoxybenzoyl, p-nitrophenyl, naphthyl, acryloyl, methacryloyl, or dialkylaminophenylcarbamoyl with alkyl groups of one to four carbon atoms; R'' is hydrogen, alkyl of one to four carbon atoms, or phenyl;

$R_2$ represents hydrogen, halogen, alkoxy with one or two carbon atoms, alkyl of one or two carbon atoms, or nitro;

$R_3$ represents hydrogen, halogen, alkoxy with one or two carbon atoms, or alkyl of one or two carbon atoms;

$R_1$, $R_2$ and $R_3$ standing in ortho, meta or paraposition with respect of the diimide group;

and

Z represents a radical of the formulae:

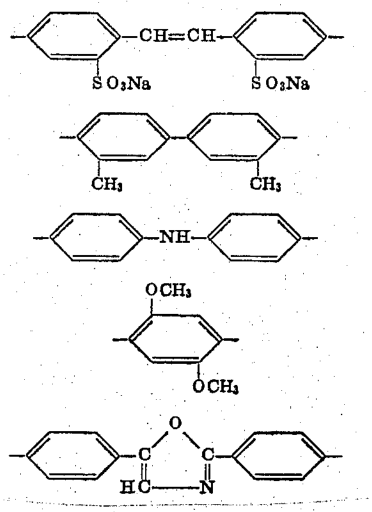

2. A process according to claim 1, wherein the compound containing at least one diazosulphone group is present in an amount within the range of 0.01 to 5 percent by weight based on the weight of photopolymerisable ethylenically unsaturated organic compound present.

3. A process according to claim 1, wherein a light source is used emitting light in the wavelength range of 2,500–5,000 A., particularly 3000–5000 A.

4. A process according to claim 1, wherein a light source is used emitting light in the wavelength range of 2500–7000 A. and wherein a photooxidation sensitizer of the class consisting of acridine, phenazine, thiazine or xanthene dyes is present in the photopolymerisation composition in an amount between 0.001 and 0.1 percent by weight with respect to the ethylenically unsaturated organic compound present.

5. A process according to claim 1, wherein the photopolymerisation initiator is (phenylsulphonyl)-(p-tolyl)-diimide.

6. A process according to claim 1, wherein the photopolymerisation initiator is (p-acetamidophenylsulphonyl)-(p-tolyl)-diimide.

7. A process according to claim 1, wherein the photopolymerisation initiator is the sodium salt of (phenylsulphonyl)-(p-sulphophenyl)-diimide.

8. A process according to claim 1, wherein the photopolymerisation initiator is (p-tolylsulphonyl)-(p-acetamidophenyl)-diimide.

9. A process according to claim 1, wherein the photopolymerisation initiator is (m-carboxy-phenylsulphonyl)-(p-carboxyphenyl)-diimide.

10. A process of producing a polymeric photographic relief image, which comprises exposing to a pattern of actinic light radiation a photographic element comprising a support and a light-sensitive layer comprising a photopolymerisable ethylenically unsaturated organic compound and as a photopolymerisation initiator a compound containing at least one diazosulphone group, said compound corresponding to one of the formulae $$X—SO_2—N=N—Y$$

and $$X'—SO_2—N=N—Z—N=N—SO_2—X'$$

wherein:

X represents phenyl, naphthyl, or phenyl substituted in ortho, meta or paraposition with respect to the sulphonyl group by alkyl of one to four carbon atoms, carboxyl, amino, dialkylamino wherein the alkyl groups comprise one to four carbon atoms, acylamino wherein the acyl group comprises two to seven carbon atoms, phenylazo or nitrophenylazo;

X' represents phenyl, aminophenyl or alkylphenyl wherein the alkyl group comprises one to four carbon atoms;

Y represents pyridyl, anthraquinonyl, napthyl, acridinyl, benzothiazolyl naphthyl, a group of the formula

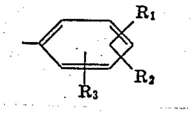

wherein:

$R_1$ represents hydrogen, alkyl of one to four carbon atoms, nitro, alkoxy of one to four carbon atoms, carboxyl, or sodium sulphonyl, or NR'R'' wherein R' is hydrogen, alkyl of one to four carbon atoms, phenyl, acyl wherein the acyl group comprises two to seven carbon atoms, p-methoxybenzoyl, p-nitrophenyl, naphthyl, acryloyl, methacryloyl or dialkylaminophenylcarbamoyl with alkyl groups of one to four carbon atoms; R'' is hydrogen, alkyl or one to four carbon atoms, or phenyl;

$R_2$ represents hydrogen, halogen, alkoxy with one or two carbon atoms, alkyl of one or two carbon atoms, or nitro;

$R_3$ represents hydrogen, halogen, alkoxy with one or two carbon atoms, or alkyl of one or two carbon atoms;

$R_1$, $R_2$ and $R_3$ standing in ortho, meta or paraposition with respect to the diimide group; of and Z represents a radical of the formulae:

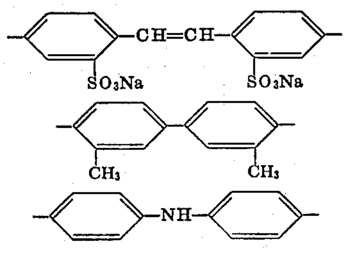

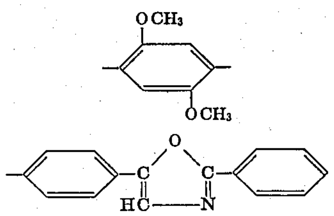

and whereby in the said layer said polymerisable ethylenically unsaturated monomer is polymerised in the portions of said layer that are exposed to said pattern of light radiation and washing away the residual unpolymerised monomer in the non-exposed areas with a solvent for said ethylenically unsaturated monomer so as to leave a polymerised photographic relief image of said pattern of light radiation.

11. A process according to claim 10 wherein the pattern of actinic light radiation emits light in the wavelength of 2,500–5,000 A., particularly 3,000–5,000 A.

12. A process according to claim 10, wherein the pattern of actinic light radiation emits light in the wavelength of 2,500–7,000 A and wherein the light-sensitive layer also comprises a photooxidation sensitizer of the class consisting of acridine, phenazine, thiazine or xanthene dyes in an amount between 0.001 and 0.1 percent by weight with respect to the ethylenically unsaturated organic compound present.

13. A photosensitive element comprising a support bearing a layer of a photosensitive composition which comprises an addition polymerizable ethylenically unsaturated compound and a photo-activatable aryl diazosulfone polymerization initiator.

14. A photosensitive composition comprising an ethylenically unsaturated photopolymerizable compound, a photoactivatable aryl diazosulfone initiator and a photo-oxidation sensitizing dye.

* * * * *